United States Patent
Sakaguchi

(10) Patent No.: US 9,559,333 B2
(45) Date of Patent: Jan. 31, 2017

(54) ORGANIC EL LIGHTING PANEL SUBSTRATE, METHOD FOR MANUFACTURING ORGANIC EL LIGHTING PANEL SUBSTRATE, ORGANIC EL LIGHTING PANEL, AND ORGANIC EL LIGHTING DEVICE

(71) Applicant: NEC LIGHTING, LTD., Tokyo (JP)

(72) Inventor: Yoshikazu Sakaguchi, Tokyo (JP)

(73) Assignee: NEC LIGHTING, LTD., Tokyo (JP)

( * ) Notice: Subject to any disclaimer, the term of this patent is extended or adjusted under 35 U.S.C. 154(b) by 0 days.

(21) Appl. No.: 14/422,849

(22) PCT Filed: Mar. 4, 2013

(86) PCT No.: PCT/JP2013/055797
§ 371 (c)(1),
(2) Date: Feb. 20, 2015

(87) PCT Pub. No.: WO2014/030367
PCT Pub. Date: Feb. 27, 2014

(65) Prior Publication Data
US 2015/0243927 A1    Aug. 27, 2015

(30) Foreign Application Priority Data
Aug. 21, 2012 (JP) .................. 2012-182746

(51) Int. Cl.
*H01L 33/60* (2010.01)
*H01L 51/52* (2006.01)
(Continued)

(52) U.S. Cl.
CPC ....... *H01L 51/5253* (2013.01); *H01L 51/5212* (2013.01); *H01L 51/0085* (2013.01); *H01L 51/56* (2013.01); *H01L 2251/5361* (2013.01)

(58) Field of Classification Search
CPC .......... H01L 33/60; H01L 33/20; H01L 33/62; H01L 33/54; H01L 33/58
(Continued)

(56) References Cited

U.S. PATENT DOCUMENTS 6,683,410 B2 * 1/2004 Hitoshi ............... H01L 51/5284
313/504
2007/0052356 A1   3/2007 Kawauchi
2013/0221341 A1   8/2013 Iwabuchi et al.

FOREIGN PATENT DOCUMENTS

JP    10-199680    7/1998
JP    2007-073338  3/2007
(Continued)

OTHER PUBLICATIONS

International Search Report, PCT/JP2013/055797, Jun. 11, 2013.

*Primary Examiner* — Quoc Hoang
(74) *Attorney, Agent, or Firm* — Young & Thompson

(57) ABSTRACT

Provided is an organic EL illumination panel substrate, and a manufacturing method therefor, that improves the manufacturing efficiency and reduces the cost for an organic EL illumination panel substrate and that is capable of achieving an organic EL illumination panel with superior yields and reliability. The organic EL illumination panel substrate has a light transmitting substrate (11), a transparent electrode (12) and an auxiliary electrode (13). The transparent electrode (12) is arranged on one face of the light transmitting substrate (11). The auxiliary electrode (13) is electrically connected to the transparent electrode (12). On the light transmitting substrate (11), there is an insulating layer (14) at a position corresponding to an electrode lead-out section for an upper electrode of an organic EL layer that is disposed facing the transparent electrode (12) and that constitutes the
(Continued)

organic EL illumination panel. There is a conductive layer between the light transmitting substrate (11) and the insulating layer (14).

7 Claims, 17 Drawing Sheets

(51) Int. Cl.
*H01L 51/00* (2006.01)
*H01L 51/56* (2006.01)

(58) Field of Classification Search
USPC .................................................. 257/40, 98
See application file for complete search history.

(56) References Cited

FOREIGN PATENT DOCUMENTS

| | | |
|---|---|---|
| JP | 2011-249075 | 12/2011 |
| JP | 2012-022878 | 2/2012 |
| JP | 2012-094348 | 5/2012 |

\* cited by examiner (h)

Photoresist application (i)

Exposure from back surface (self alignment)

(j)

Development (k)

Baking (a)

(b)

(g)

Transparent electrode formation (h)

Photoresist application (i)

Exposure from back surface (self alignment)

(j)

Development (k)

Baking (o)

Exposure (p)

Development・baking (q)

Photoresist application (r)

Exposure (s)

Development・baking

ORGANIC EL LIGHTING PANEL SUBSTRATE, METHOD FOR MANUFACTURING ORGANIC EL LIGHTING PANEL SUBSTRATE, ORGANIC EL LIGHTING PANEL, AND ORGANIC EL LIGHTING DEVICE

TECHNICAL FIELD

The present invention relates to an organic EL lighting panel substrate, a method for manufacturing an organic EL lighting panel substrate, an organic EL lighting panel, and an organic EL lighting device.

BACKGROUND ART

In organic EL (electroluminescence) lighting panels used for organic EL lighting devices, generally, transparent electrodes formed of transparent conductive materials such as ITO, ZnO, $SnO_2$ (NESA glass), and the like are used as electrodes at the side where the light is led out. Since the volume resistivities of the above-described transparent conductive materials are high, the sheet resistances become high in the case where the materials are used as thin films. Therefore, in an organic EL lighting panel using the above-described transparent electrode, a voltage drop due to increase in wiring resistance is caused as distanced from a transparent electrode end (feed terminal from power supply), i.e., as approached toward the inside (center) of the organic EL lighting panel. When the voltage drops at an electrode part, it causes an electric power loss at the electrode part as well as decreases in luminance and chromaticity, and thereby the luminance uniformity and chromaticity uniformity within a surface of an organic EL lighting panel are decreased. The above-described decreases in luminance and chromaticity are caused because an organic EL element is an electroluminescent type element, an electric field at the center of the element becomes smaller than that at the vicinity of a feed terminal because of a voltage drop, the injection efficiency of a carrier (hole/electron) is decreased, and the luminous efficiency is decreased.

Hence, for reducing the wiring resistance at the transparent electrode side, the provision of an auxiliary electrode on a transparent electrode has been considered (see, for example, Patent Documents 1 and 2). At this time, an end-insulating layer for covering the end of the transparent electrode is provided for avoiding the conduction between an upper electrode (in the case where the transparent electrode is an anode, a cathode) provided at the upper side relative to a translucent substrate and a transparent electrode, and an interlayer-insulating layer for covering the auxiliary electrode is provided for avoiding the conduction between the auxiliary electrode and an organic EL element (see, for example, Patent Document 2).

The organic EL lighting panel is manufactured, as shown in FIGS. 9A to C, by the following steps, for example. A translucent electrode material (for example, ITO) is laminated (formed) on a translucent substrate and the patterning using a photoresist is performed to form a translucent electrode layer. After removing the photoresist, an auxiliary electrode-forming material layer is formed, and an auxiliary electrode of a desired pattern is formed by a photolithography step or the like. Specifically, an auxiliary electrode-forming material layer is laminated all over a translucent substrate on which a translucent electrode layer is formed, a photoresist is applied thereto, the auxiliary electrode-forming material layer is formed into a desired pattern by an exposure through a mask on which a desired pattern is formed, a development, and an etching, and thereafter the resist on the auxiliary electrode-forming material layer is removed. Thereafter, an interlayer-insulating layer for covering the auxiliary electrode and an end-insulating layer for the end of the translucent electrode layer are each formed by a photolithography step in the same manner as described above. Then, an organic layer and an upper electrode layer are laminated thereon to manufacture an organic EL lighting panel.

CITATION LIST

Patent Document(s)

Patent Document 1: JP10(1998)-199680 A
Patent Document 2: JP2011-249075 A

SUMMARY OF INVENTION

Problem to be Solved by the Invention

In the manufacture of an organic EL lighting panel substrate including the auxiliary electrode and the interlayer-insulating layer, a step of forming a translucent electrode layer, a step of patterning it into a panel shape, a step of forming an auxiliary electrode, a step of patterning it into a wiring pattern, and steps of forming and patterning an interlayer-insulating layer and an end-insulating layer are performed separately. Therefore, multiple steps of photolithography and photo-etching are required for forming the respective members, and thus manufacturing costs including material costs and processing costs are highly increased. As a result, the component cost as an organic EL lighting panel becomes very expensive. Moreover, there is a case in which the respective steps are handled in different factories. In such a case, the manufacturing efficiency is further decreased and the increase in cost is inevitable.

Furthermore, since resist residues and foreign matters often remain on a substrate due to a repetition of a photolithography step and the like, there has been a problem that defects/problems such as a short circuit and the like are caused frequently in an organic EL panel and that the yields and reliability are decreased significantly.

Hence, the present invention is intended to provide an organic EL lighting panel substrate and a method for manufacturing the same that can improve the manufacturing efficiency of an organic EL lighting panel substrate to reduce the cost and can achieve an organic EL lighting panel of excellent yield and reliability.

Means for Solving Problem

In order to achieve the above object, the present invention provides an organic EL (electroluminescence) lighting panel substrate including: a translucent substrate; a transparent electrode; and an auxiliary electrode, wherein the transparent electrode is arranged on a surface of the translucent substrate, the auxiliary electrode is electrically connected to the transparent electrode, and the organic EL lighting panel substrate further includes: an insulating layer at a position corresponding to an electrode lead-out part of an upper electrode of an organic EL layer that forms an organic EL lighting panel, the upper electrode being provided above the translucent substrate in such a manner as to face the transparent electrode; and a conductive layer between the translucent substrate and the insulating layer.

The present invention also provides a method for manufacturing an organic EL lighting panel substrate including: a transparent electrode formation step of forming a transparent electrode on a surface of a translucent substrate; an auxiliary electrode formation step of forming an auxiliary electrode so as to be electrically connected to the transparent electrode; and an insulating layer formation step of forming an insulating layer at a position corresponding to an electrode lead-out part of an upper electrode of an organic EL layer that forms an organic EL lighting panel, the upper electrode being provided above the translucent substrate in such a manner as to face the transparent electrode.

The present invention also provides an organic EL lighting panel including: an organic EL lighting panel substrate; an organic EL layer; and an upper electrode, wherein the organic EL lighting panel substrate is the organic EL lighting panel substrate according to the present invention, and the organic EL layer and the upper electrode are provided on the transparent electrode in this order.

The present invention also provides an organic EL lighting device including the organic EL lighting panel according to the present invention.

Effects of the Invention

According to the present invention, it is possible to improve the manufacturing efficiency of an organic EL lighting panel substrate to reduce the cost and is also possible to achieve an organic EL lighting panel of excellent yield and reliability.

MODE FOR CARRYING OUT THE INVENTION

Hereinafter, organic EL lighting panel substrates, organic EL lighting panels, and organic EL lighting devices of the present invention will be described in detail with reference to the figures. However, the present invention is not limited to the following embodiments. Note here that, in FIGS. 1 to 8, identical parts may be indicated with identical numerals and symbols and the descriptions as to the identical parts may be omitted. In the figures, for convenience in explanation, the structures of the respective components may be appropriately simplified and the dimensions and the like of the respective components may be schematically described and may be different from the actual dimensions and the like.

Embodiment 1

Figure 1:
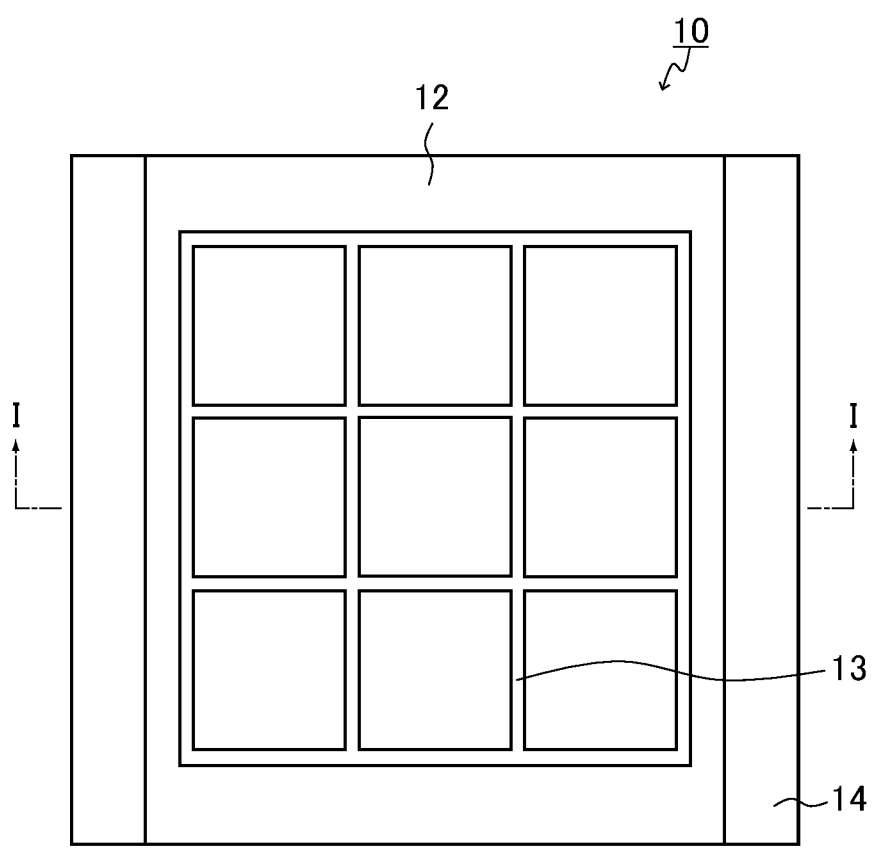
FIG. 1(a) is a plan view showing the configuration of an example of an organic EL lighting panel substrate of the present invention (Embodiment 1).
FIG. 1(b) is a cross sectional view of the organic EL lighting panel substrate shown in FIG. 1(a) as viewed from the line I-I.
Figure 1:
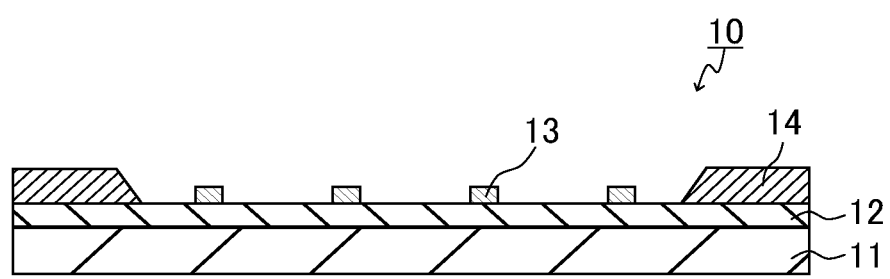

An organic EL lighting panel substrate of the present embodiment is an example of an organic EL lighting panel substrate including an insulating layer at the position corresponding to an electrode lead-out part of an upper electrode provided above a translucent substrate and including a conductive layer of a transparent electrode between the translucent substrate and the insulating layer. FIG. 1 shows the configuration of the organic EL lighting panel substrate of the present embodiment. FIG. 1(a) is a plan view of the organic EL lighting panel substrate of the present embodiment. FIG. 1(b) is a cross sectional view of the organic EL lighting panel substrate shown in FIG. 1(a) as viewed from the line I-I.

As shown in FIG. 1, organic EL lighting panel substrate 10 of the present embodiment includes translucent substrate 11, transparent electrode 12, auxiliary electrode 13, and insulating layer 14 as main components. Transparent electrode 12 and auxiliary electrode 13 are arranged on translucent substrate 11 in this order from the translucent substrate 11 side. Specifically, transparent electrode 12 is arranged all over a surface of translucent substrate 11. Auxiliary electrodes 13 are arranged on transparent electrode 12 at constant intervals. Transparent electrode 12 and auxiliary electrode 13 are electrically connected.

Examples of the material for forming translucent substrate 11 include inorganic materials and organic materials. Examples of the inorganic material include alkali-free glasses, soda-lime glasses, borosilicate glasses, aluminosilicate glasses, and fused silica. Examples of the organic material include polyester resins such as polyethylene naphthalate, polyethylene terephthalate, and the like; acrylic resins such as ethyl methacrylate, methyl methacrylate, ethyl acrylate, methyl acrylate, and the like; alicyclic olefin resins such as a copolymer of norbornene and ethylene, and the like; polyethersulfone; and triacetylcellulose. The thickness of translucent substrate 11 is not particularly limited, and, for example, can be set appropriately according to translucent substrate 11-forming materials, use environments, and the like.

In organic EL lighting panel substrate 10 of the present embodiment, translucent substrate 11 is formed of a single-layered substrate. However, the present invention is not limited to this example and, for example, the translucent substrate may be formed of a plurality of layers.

Transparent electrode 12 can be formed by a conventionally known method such as sputtering or the like using a transparent conductive thin film, for example. Examples of the material for forming the transparent conductive thin film include ITO, ZnO, IZO (registered trademark, indium-zinc oxide), IGZO (indium-gallium-zinc oxide), GZO (gallium-zinc oxide), and $SnO_2$.

Specific examples of the material for forming auxiliary electrode 13 include Cr (chromium), Cu (copper), Al (aluminum), Ag (silver), Au (gold), Mo (molybdenum), W (tungsten), Ni (nickel), and the alloys thereof. Examples of the alloy include Al—Mo (aluminum-molybdenum), Al—Nd (aluminum-neodymium), Al—Ni (aluminum-nickel), and Mo—Nb (molybdenum-niobium). Among them, a three-layered laminate of Mo—Nb/Al—Nd/Mo—Nb (MAM) is particularly preferable from the view point of environment-friendliness, reliability, and general versatility (price). The volume resistivity of the auxiliary electrode 13-forming material is, at 20° C., preferably in the range from $1.59 \times 10^{-8}$ to $13 \times 10^{-8}$ $\Omega \cdot m$ and more preferably in the range from $1.59 \times 10^{-8}$ to $7 \times 10^{-8}$ $\Omega \cdot m$. The lower limit of the volume resistivity, "$1.59 \times 10^{-8}$ $\Omega \cdot m$", is the resistance of Ag (silver) having the lowest resistance. It is preferable that the volume resistivity is in the above-described range because it increases the effect of reducing the wiring resistance at the transparent electrode side. When the MAM is used as an auxiliary electrode, the thicknesses of the respective layers are preferably in the range from 30 nm to 50 nm, in the range from 200 nm to 500 nm, and in the range from 30 nm to 50 nm in this order.

By arranging auxiliary electrode 13 of this type on transparent electrode 12, auxiliary electrode 13 is electrically connected to transparent electrode 12. The auxiliary electrode 13 is provided within a surface of organic EL lighting panel substrate 10 in a grid pattern. Therefore, when organic EL lighting panel is formed using organic EL lighting panel substrate 10, the wiring resistance at the transparent electrode 12 side can be reduced, and the luminance uniformity and chromaticity uniformity within a surface of organic EL lighting panel can be improved. Note here that, the arrangement pattern of the auxiliary electrode is not limited to a grid pattern and can be any pattern as long as the wiring resistance at the transparent electrode side can be reduced. Also, in the present invention, the connection form of the auxiliary electrode and the transparent electrode is not limited to the above-described connection form, and can be any connection form as long as the auxiliary electrode is electrically connected to the transparent electrode.

Auxiliary electrode 13 can be patterned as follows. A photolithography step is performed using an insulating photoresist on transparent electrode 12, and the resist at an auxiliary electrode-forming part is removed. A layer of an auxiliary electrode-forming material is formed all over the substrate obtained as described above, and then the resist is removed. Thereby, the auxiliary electrode-forming material is lifted off except for the auxiliary electrode part, and thereby the auxiliary electrode can be patterned. Furthermore, at the time of the exposure in the photolithography step, insulating layer 14 can be formed on a translucent substrate at the position corresponding to an upper electrode lead-out part. The formation of insulating layer 14 can also be performed by causing an insulating photoresist remain at the position corresponding to an upper electrode lead-out part using a slit photomask such as a gray-tone mask or a phase shift mask such as a halftone mask.

Figure 2:
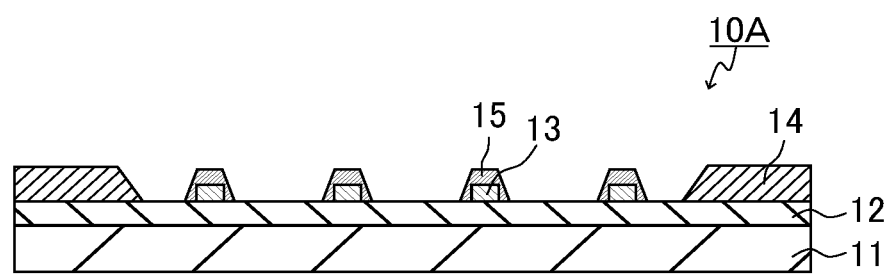
FIG. 2 is a cross sectional view showing the configuration of another example of an organic EL lighting panel substrate of Embodiment 1.

An organic EL lighting panel substrate of the present embodiment may be in a form in which it further includes an auxiliary electrode-insulating member and the auxiliary electrode is covered with the auxiliary electrode-insulating member. FIG. 2 is a cross sectional view showing an example of this form. As shown in FIG. 2, organic EL lighting panel substrate 10A of this example has the same configuration as organic EL lighting panel substrate 10 shown in FIG. 1 except that organic EL lighting panel substrate 10A includes auxiliary electrode-insulating member 15, and auxiliary electrode 13 is covered with auxiliary electrode-insulating member 15 except for the part that is in contact with transparent electrode 12.

Auxiliary electrode-insulating member 15 has a function of preventing the diffusion of auxiliary electrode 13 and a function of insulating an auxiliary electrode from an organic EL layer and an upper electrode formed above the auxiliary electrode at the time of forming an organic EL lighting panel using organic EL lighting panel substrate 10A.

Examples of the material forming auxiliary electrode-insulating member 15 include inorganic materials and polymeric materials, and it is preferable that auxiliary electrode-insulating member 15 is formed by a photolithography step using an insulating photoresist. Examples of the insulating photoresist include photosensitive polymeric materials such as acrylic materials, novolac materials, polyimide materials, and the like. The thickness of auxiliary electrode-insulating member 15 is, for example, about 500 nm to 1 μm. In the case where an insulating member is formed using the insulating photoresist, for example, the insulating member can be formed only by a photolithography step without performing a photo-etching step, and therefore the load from steps can be reduced.

Auxiliary electrode-insulating member 15 can be patterned on auxiliary electrode 13 by applying an insulating photoresist all over the substrate and then exposing from the back surface. Since the light is blocked at a metal auxiliary electrode part, the exposure pattern is self-aligned, and auxiliary electrode-insulating member 15 can be completely patterned without manufacturing or using an expensive photomask. Thereafter, the substrate is subjected to the development and post-baking to manufacture an organic EL lighting panel substrate.

An organic EL lighting panel substrate having the configuration of the present embodiment can be manufactured without patterning transparent electrode 12. Therefore, the number of photolithography steps can be reduced, and defects and problems due to remaining resist residues and foreign matters on a substrate can be suppressed as compared to a conventional organic EL lighting panel substrate.

Next, an example of a method for manufacturing organic EL lighting panel substrate 10A will be described with reference to FIGS. 3A and 3B. Note here that the method for manufacturing organic EL lighting panel substrate 10A is not limited to the following example.

Figure 3A:
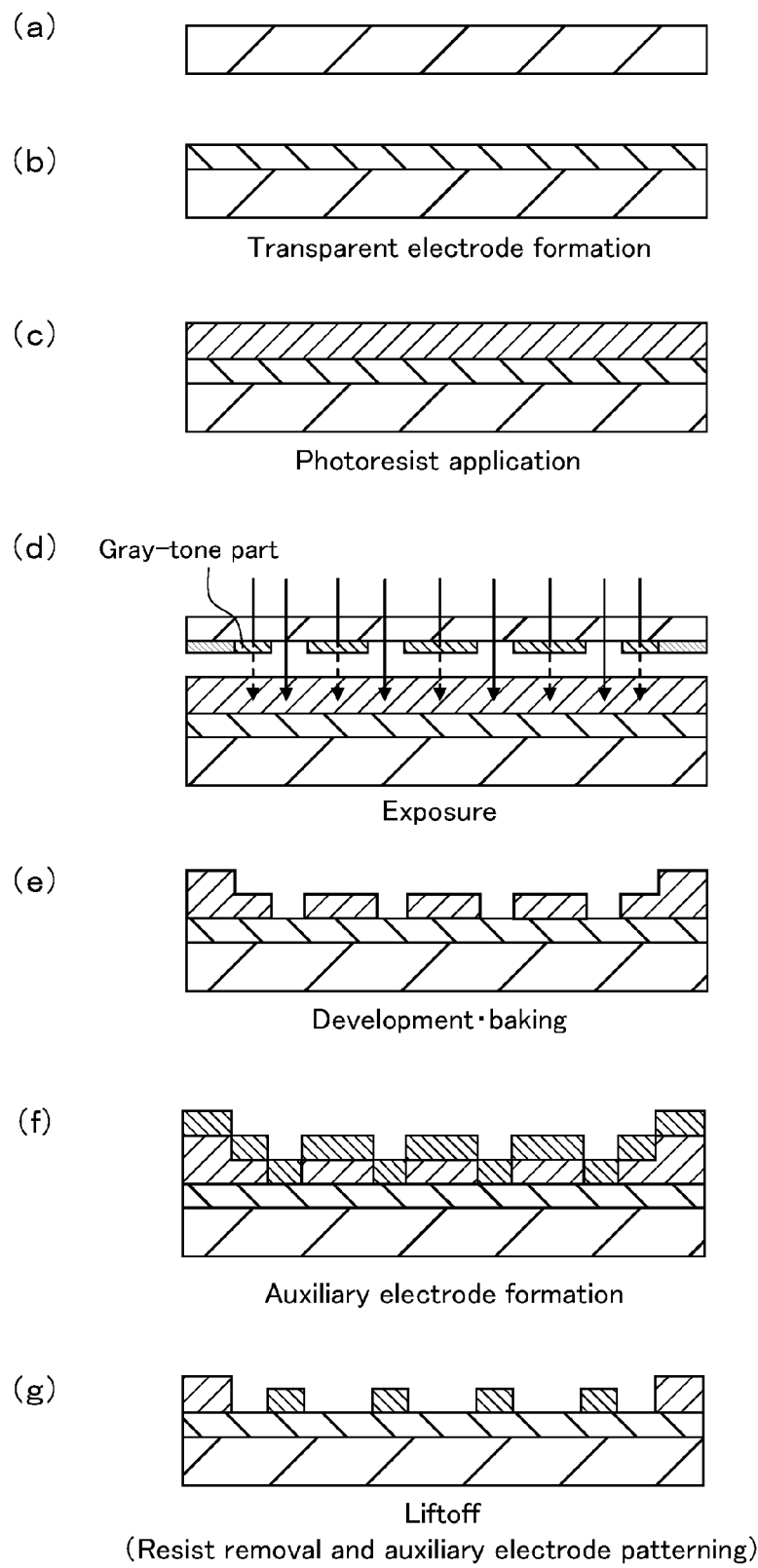
FIGS. 3A(a) to (g) show cross sectional views for illustrating an example of a method for manufacturing the organic EL lighting panel substrate of Embodiment 1.

First, as shown in FIG. 3A(a), transmissive substrate 11 is provided. Then, as shown in FIG. 3A(b), transparent electrode 12 formed of ITO or the like is formed on a surface of translucent substrate 11 by sputtering, for example (transparent electrode formation step). Next, as shown in FIG. 3A(c), an insulating photoresist is applied. Then, as shown in FIGS. 3A(d) and (e), the substrate is exposed through a photomask followed by the development and baking to pattern the photoresist. FIGS. 3A(d) and (e) show the case in which the photoresist is a positive type photoresist and the photomask is a gray-tone mask including an exposure part for the part corresponding to an auxiliary electrode-forming part, a light-blocking part for the part corresponding to an upper electrode lead-out part, and a gray-tone part for the part corresponding to a lift-off part (part on which an auxiliary electrode is not formed). The use of the gray-tone mask makes it possible to attain the thickness of the insulating photoresist at the part corresponding to the upper electrode lead-out part thicker than the thickness of the photoresist at the part corresponding to the lift-off part. Here, since the photoresist used in the present invention can be any photoresist as long as the resist can be removed at an auxiliary electrode-forming part, the photoresist is not limited to a positive type and can be a negative type. In the case of using a negative type photoresist, a gray-tone mask including a light-blocking part for the part corresponding to an auxiliary electrode-forming part, an exposure part for the part corresponding to an upper electrode lead-out part, and a gray-tone part for the part corresponding to a lift-off part (part on which an auxiliary electrode is not formed) may be used as a photomask. Furthermore, the photomask is not limited to a slit photomask such as a gray-tone mask, and a phase shift mask such as a halftone mask or the like may be used. Next, as shown in FIG. 3A(f), after forming a layer of an auxiliary electrode-forming material all over the substrate (film formation), the photoresist is removed. Thereby, as shown in FIG. 3A(g), the auxiliary electrode-forming material is lifted off except for the auxiliary electrode-forming part, and thus the auxiliary electrode can be patterned (auxiliary electrode formation step). Furthermore, the use of a gray-tone mask or the like at the time of the exposure (FIG. 3A(d)) allows the insulating photoresist to remain at the position corresponding to the upper electrode lead-out part, and thereby insulating layer 14 in the present invention can be formed (insulating layer formation step).

Figure 3B:
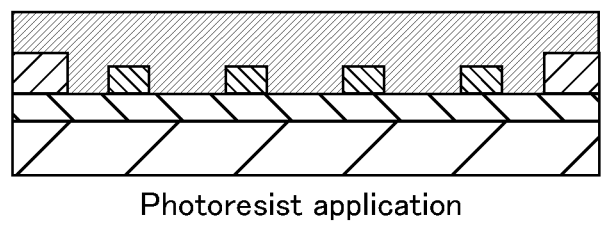
FIGS. 3B(h) to (k) show cross sectional views for illustrating an example of a method for manufacturing the organic EL lighting panel substrate of Embodiment 1.
Figure 3B:
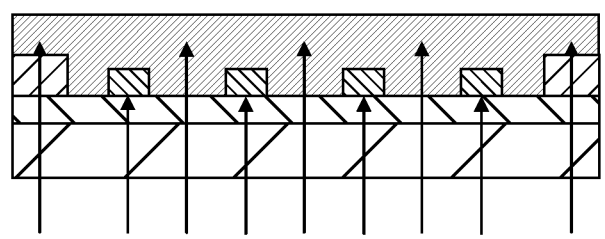
Figure 3B:
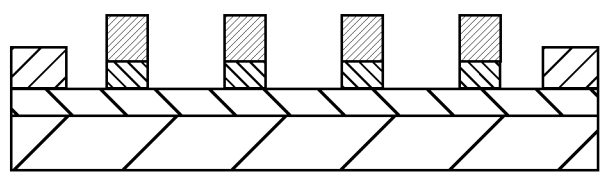
Figure 3B:
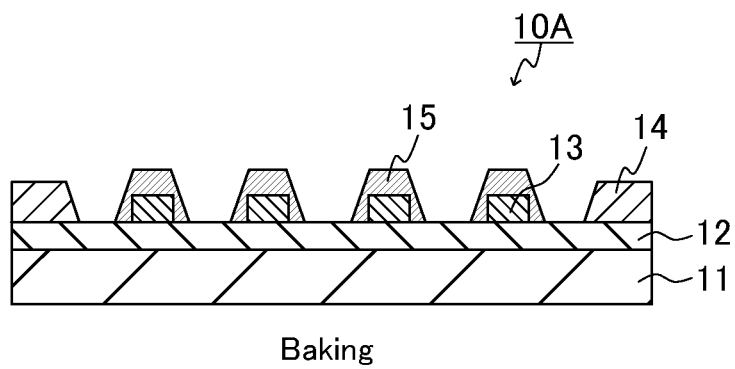

Next, as shown in FIG. 3B(h), an insulating photoresist is applied all over translucent substrate 11 at the side on which auxiliary electrode 13 is formed. Then, as shown in FIG. 3B(i), translucent substrate 11 is exposed from the back surface (the surface opposite to the photoresist-applied surface), and the development is performed as shown in FIG. 3B(j). At this time, since the light is blocked at the part on which auxiliary electrode 13 is formed, the photoresist can be patterned to suit the auxiliary electrode 13-forming part without using a photomask or the like. Then, as shown in FIG. 3B(k), by baking the substrate after development (post-bake), auxiliary electrode-insulating member 15 is formed. The thickness of auxiliary electrode-insulating member 15 is preferably in the range from 0.5 µm to 1.5 µm. In this manner, for example, organic EL lighting panel substrate 10A shown in FIG. 2 can be manufactured. Note here that the method for manufacturing organic EL lighting panel substrate 10A is not limited to this example.

Embodiment 2

Figure 4:
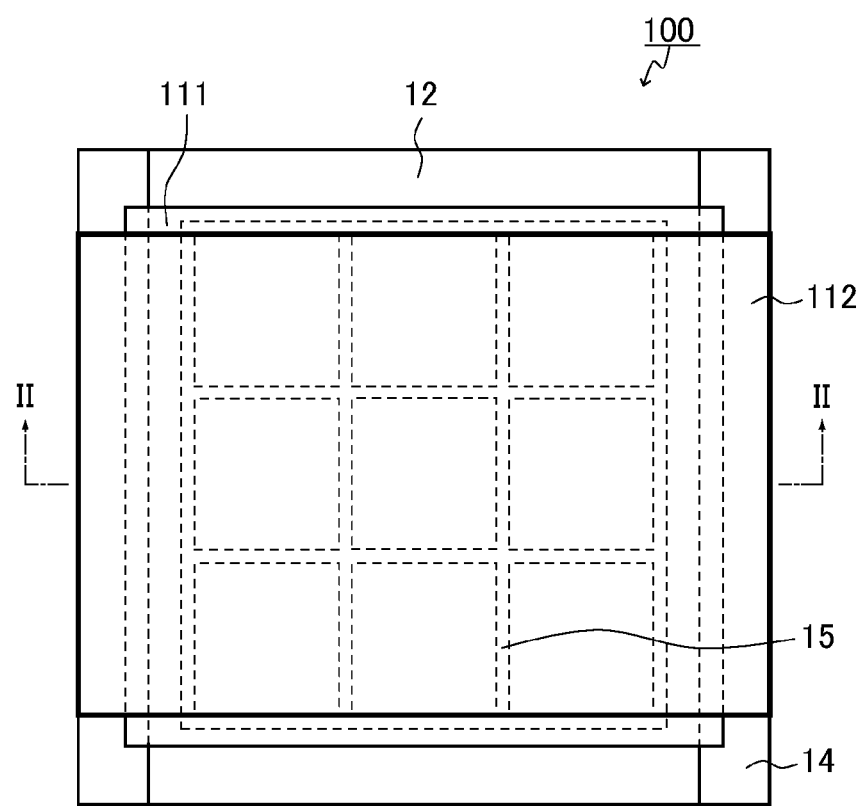
FIG. 4(a) is a plan view showing the configuration of an example of an organic EL lighting panel of the present invention (Embodiment 2).
FIG. 4(b) is a cross sectional view of the organic EL lighting panel shown in FIG. 4(a) as viewed from the line II-II.
Figure 4:
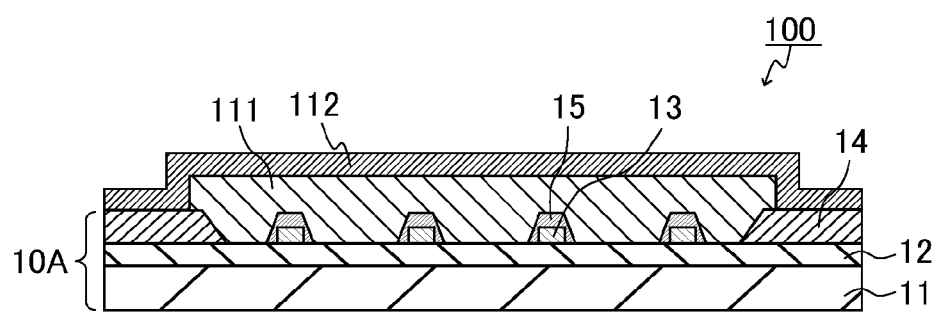

An organic EL lighting panel of the present embodiment is an example of an organic EL lighting panel using organic EL lighting panel substrate 10A of Embodiment 1 shown in FIG. 2. FIG. 4 shows the configuration of an organic EL lighting panel of the present embodiment. FIG. 4(a) is a plan view of an organic EL lighting panel of the present invention. FIG. 4(b) is a cross sectional view of the organic EL lighting panel shown in FIG. 4(a) as viewed from the line II-II.

As shown in FIG. 4, organic EL lighting panel 100 of the present embodiment includes organic EL lighting panel substrate 10A, organic EL layer 111, and upper electrode 112 as main components. In organic EL lighting panel substrate 10A, auxiliary electrode 13 is covered with auxiliary electrode-insulating member 15 except for the part that is in contact with transparent electrode 12. Organic EL layer 111 and upper electrode 112 are laminated on transparent electrode 12 and auxiliary electrode-insulating member 15 in this order. Since organic EL lighting panel 100 uses the organic EL lighting panel substrate 10A shown in FIG. 2, the effect described in Embodiment 1 can be achieved.

Details of translucent substrate 11, transparent electrode 12, and auxiliary electrode 13 are the same as those described above (hereinafter, the same applies). Transparent electrode 12 serves as an anode, for example.

Organic EL layer 111 includes: a light-emitting layer that contains an organic electroluminescence substance; a hole transport layer and an electron transport layer that sandwich the light-emitting layer; and a hole injection layer and an electron injection layer that sandwich the hole transport layer and the electron transport layer, for example. Furthermore, organic EL layer 111 may further include a carrier-blocking layer that blocks a hole or an electron and improves the luminous efficiency, for example. Organic EL layer 111 is a laminate in which a hole injection layer, a hole transport layer, a light-emitting layer, an electron transport layer, and an electron injection layer are laminated from the transparent electrode 12 side in this order, for example.

The hole injection layer is provided so as to lower the level of an injection barrier to a hole injected from transparent electrode 12 (anode) to organic EL layer 111 and to ease the difference in the energy level between the anode and the hole transport layer to allow the easy injection of a hole injected from the anode to the hole transport layer. The hole injection layer is formed of a hole injection layer material. Examples of the hole injection layer material include hole injection organic materials. Specific examples thereof include copper phthalocyanine and arylamine derivatives such as starburst type aromatic amine and the like. The hole injection organic material may be a material chemically doped with an inorganic matter such as vanadium pentoxide, molybdenum trioxide, or the like or an organic matter such as F4-TCNQ or the like for further lowering the level of the injection barrier and the drive voltage, for example.

The hole transport layer is preferably formed of a hole transport layer material. The hole transport layer material has right amount of ionization potential for increasing the hole mobility to the light-emitting layer and, at the same time, has an electron affinity for preventing the leak of an electron from the light-emitting layer. Specific examples of the hole transport layer material include triphenyldiamines and starburst type aromatic amine. Examples of the triphenyldiamines include bis(di(p-tolyl)aminophenyl)-1,1-cyclohexane, 4,4'-bis(m-tolylphenylamino)biphenyl (TPD), and N,N'-diphenyl-N—N-bis(1-naphthyl)-1,1'-biphenyl)-4,4'-diamine (α-NPD).

The light-emitting layer recombines electrons and holes injected from electrodes to emit fluorescence, phosphorescence, or the like. The light-emitting layer contains a light-emitting material. Examples of the light-emitting material include low-molecular weight compounds such as tris(8-quinolinol)aluminum complex ($Alq_3$), bis diphenyl vinyl biphenyl (BDPVBi), 1,3-bis(p-t-butylphenyl-1,3,4-oxadiazolyl)phenyl (OXD-7), N,N'-bis(2,5-di-t-butylphenyl) perylene tetracarboxylic diimide (BPPC), 1,4-bis(N-p-tolyl-N-4-(4-methyl styryl)phenylamino)naphthalene, and the like; and high-molecular weight compounds such as a polyphenylene vinylene polymer and the like.

Furthermore, for example, the light-emitting material is formed of a two-component system of a host and a dopant and may be a material in which excited-state energy generated in a host molecule is transferred to a dopant molecule to cause the dopant molecule to emit light. Examples of such a light-emitting material include the above-described light-emitting materials, the electron transport layer materials that will be described below, and the above-described hole transport layer materials. Specific examples thereof include materials obtained by doping hosts with dopants according to the following combinations:
Host: a quinolinol metal complex such as $Alq_a$ or the like
Dopant: a quinacridone derivative such as
4-dicyanomethylene-2-methyl-6-(p-dimethylaminostyryl)-4H-pyran (DCM), 2,3-quinacridone, or the like or a coumarin derivative such as 3-(2'-benzothiazole)-7-diethylaminocoumarin or the like;
Host: an electron transport material bis(2-methyl-8-hydroxyquinoline)-4-phenylphenol-aluminum complex
Dopant: a condensed polycyclic aromatic compound such as perylene or the like;
Host: a hole transport layer material 4,4'-bis(m-tolylphenylamino)biphenyl (TPD)
Dopant: rubrene or the like; and
Host: a carbazole compound such as 4,4'-biscarbazolylbiphenyl (CBP),
4,4'-bis(9-carbazolyl)-2,2'-dimethylbiphenyl (CDBP), or the like
Dopant: a platinum complex or an iridium complex such as tris-(2 phenylpyridine)iridium
($Ir(ppy)_3$), bis(4,6-di-fluorophenyl)-pyridinate-N,C2) iridium(picolinate) (FIr(pic)),
bis(2-2'-benzothienyl)-pyridinate-N,C3iridium(acetylacetonate) ($Btp_2Ir(acac)$),
tris-(picolinate)iridium ($Ir(pic)_3$), bis(2-phenylbenzothiozolate-N, C2)iridium(acetylacetonate)
($Bt_2Ir(acac)$), or the like.

The light-emitting material can be selected appropriately according to a desired color of the light to be emitted from an organic EL lighting panel, for example. Specific examples of the selection are as follows:
in the case of green light emission:
Host: $Alq_3$
Dopant: quinacridone, coumarin, or the like or
Host: CBP
Dopant: $Ir(ppy)_3$ or the like;
in the case of blue light emission:
Host: 4,4'-bis(2,2-diphenylethenyl)-1,1'-biphenyl (DPVBi)
Dopant: perylene, a distyrylallylene derivative or the like or
Host: CBP
Dopant: FIr(pic) or the like;
in the case of green to blue-green light emission:
Host: $Alq_3$
Dopant: OXD-7 or the like;
in the case of red to orange light emission:
Host: $Alq_3$
Dopant: DCM or
4-(dicyanomethylene)-2-t-butyl-6-(1,1,7,7-tetramethyl-julolidyl-9-enyl)-4H-pyran (DCJTB) or
Host: CBP
Dopant: $Ir(pic)_3$ or the like; and
in the case of yellow light emission:
Host: $Alq_3$
Dopant: rubrene or
Host: CBP
Dopant: $Bt_2Ir(acac)$ or the like.

An example of the light-emitting layer of emitting white light includes a three-layered layer that contains light-emitting materials emitting red, green, and blue. In addition to this, examples of the light-emitting layer of emitting white light include a two-layered layer that contains light-emitting materials emitting complementary colors such as blue and yellow, and the like and a single-layered layer obtained by forming a layer using the light-emitting materials of the respective colors by multiple co-evaporation or the like so that the light-emitting materials of the respective colors are mixed. Furthermore, a layer obtained by planarly aligning, in order, fine pixels of red, blue, green, and the like of the light-emitting materials that form the respective layers of the three-layered layer and the two-layered layer may be used as the light-emitting layer emitting white light.

The electron transport layer is preferably formed of an electron transport layer material. The electron transport layer material has right amount of ionization potential for increasing the electron mobility to the light-emitting layer and, at the same time, has an electron affinity for preventing the leak of a hole from the light-emitting layer. Specific examples of the electron transport layer material include organic materials such as oxadiazole derivatives such as 2-(4-biphenylyl)-5-(4-t-butylphenyl)-1,3,4-oxadiazole (BuPBD), OXD-7, and the like; triazole derivatives; quinolinol metal complexes; and the like. Furthermore, the electron transport layer material may be a material obtained by causing organic material to be chemically doped with an electron-donating substance such as an alkali metal such as lithium or the like, for example.

The electron injection layer is provided to ease the difficulty in electron injection from the cathode to the electron transport layer due to a great difference in energy between the work function of a metal material such as aluminum or the like used for forming a cathode and the electron affinity (LUMO level) of the electron transport layer, for example. The electron injection layer is preferably formed of an electron injection layer material. An example of the electron injection layer material includes a material with a low work function, and specific examples thereof include fluorides and oxides of alkali metals such as lithium, cesium, and the like and alkali earth metals such as calcium and the like; magnesium-silver; and lithium aluminum alloy.

An example of the carrier-blocking layer includes a hole-blocking layer. The hole-blocking layer is provided between the light-emitting layer and the electron transport layer for blocking a hole passing through the light-emitting layer without involving in light emission and increasing the recombination probability in the light-emitting layer. Examples of materials for forming the hole-blocking layer include 2,9-dimethyl-4,7-diphenyl-1,10-phenanthroline (BCP), triphenyldiamine derivatives, and triazole derivatives.

The thickness of organic EL layer 111 is not particularly limited, and, for example, the thicknesses of the respective layers that form organic EL layer 111 are each in the range from 1 nm to 500 nm. The thickness of the total of the respective layers is, for example, in the range from 100 nm to 1000 nm.

The method for forming organic EL layer 111 can be, for example, a conventionally known method. For example, in the case where the light-emitting layer is formed of the above-described low-molecular weight compound (low-molecular weight organic EL material), for example, the light-emitting layer can be formed by a vacuum evaporation method utilizing resistance heating of the low-molecular weight organic EL material. Furthermore, for example, in the case where the light-emitting layer is formed of the above-described high-molecular weight compound (high-molecular weight organic EL material), for example, the light-emitting layer may be formed by applying the high-molecular weight organic EL material by a slit coating method, a flexographic printing method, an ink-jet method, or the like.

Upper electrode 112 is an electrode paired with transparent electrode 12. In the case where transparent electrode 12 serves as an anode, the upper electrode serves as a cathode. Upper electrode 112 may be translucent or not translucent, for example. In the case where upper electrode 112 is an electrode that is not translucent, a lightproof material such as a metal thin film such as aluminum, silver, or the like can be used for upper electrode 112, for example. The electrode of this type is preferable because it allows the light emitted toward the upper electrode 112 side to be reflected to the transparent electrode 12 side during the light emission of organic EL layer 111 and suppresses the decrease in the amount of emitting light from a light emitting surface. The thickness of upper electrode 112 is not particularly limited. In consideration of the voltage drop due to wiring resistance, it is preferable that the upper electrode 112 is thick, and the thickness of upper electrode 112 can be set, for example, in the range from 50 nm to 300 nm. On the other hand, in the case where upper electrode 112 is a translucent electrode, for example, upper electrode 112 can be formed using a material similar to those for forming transparent electrode 12. The electrode of this type allows the manufacture of an organic EL element that becomes transparent when it is not emitting the light, for example. The method for forming upper electrode 112 can be, for example, a conventionally known method. In the case where upper electrode 112 is formed of a metal such as aluminum or the like, upper electrode 112 can be formed by vacuum evaporation utilizing resistance heating of the metal, electron beam (EB) evaporation, or sputtering. Since an organic EL lighting panel of the present invention includes a connection part with an external wiring member, an end of transparent electrode 12 and an end of upper electrode 112 may be extended.

Organic EL lighting panel 100 is formed in the above-described manner. Note here that, in the present invention, for cutting off elements in an organic EL lighting panel from the outside world, the elements may be sealed using a conventionally known blocking material, for example.

Organic EL lighting panel 100 can be applied, for example, to an organic EL lighting device; a backlight of a liquid crystal display or the like; or the like, and is preferably applied to an organic EL lighting device, a backlight, or the like that requires a big panel, specifically, a panel size of 10 cm×10 cm, for example. Note here that, an organic EL lighting panel of the present invention is not limited to the above-described usage but can be applied to a wide range of field.

Embodiment 3

Figure 5:
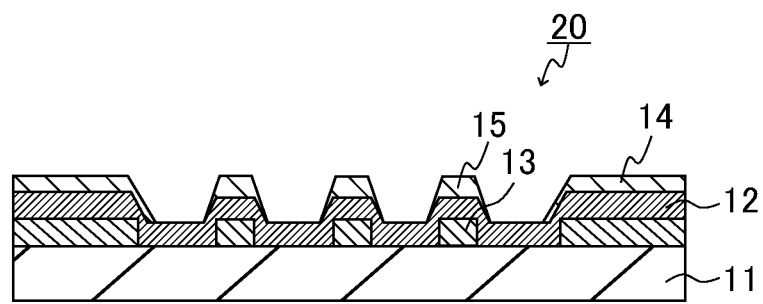
FIG. 5 is a cross sectional view showing the configuration of another example of an organic EL lighting panel substrate of the present invention (Embodiment 3).

An organic EL lighting panel substrate of the present embodiment includes a transparent electrode arranged all over a surface of a translucent substrate and includes an auxiliary electrode patterned between the translucent substrate and the transparent electrode. Furthermore, an organic EL lighting panel substrate of the present embodiment is an example of an organic EL lighting panel substrate in which a layer formed of the same material as an auxiliary electrode is arranged on the translucent substrate at the position corresponding to an upper electrode lead-out part and an insulating layer is arranged on the transparent electrode at the positions corresponding to the auxiliary electrode and the upper electrode lead-out part. FIG. 5 shows the configuration of organic EL lighting panel substrate 20 of the present embodiment.

Next, an example of a method for manufacturing organic EL lighting panel substrate 20 will be described with reference to FIGS. 6A and 6B. Note here that the method for manufacturing organic EL lighting panel substrate 20 is not limited to the following example.

Figure 6A:
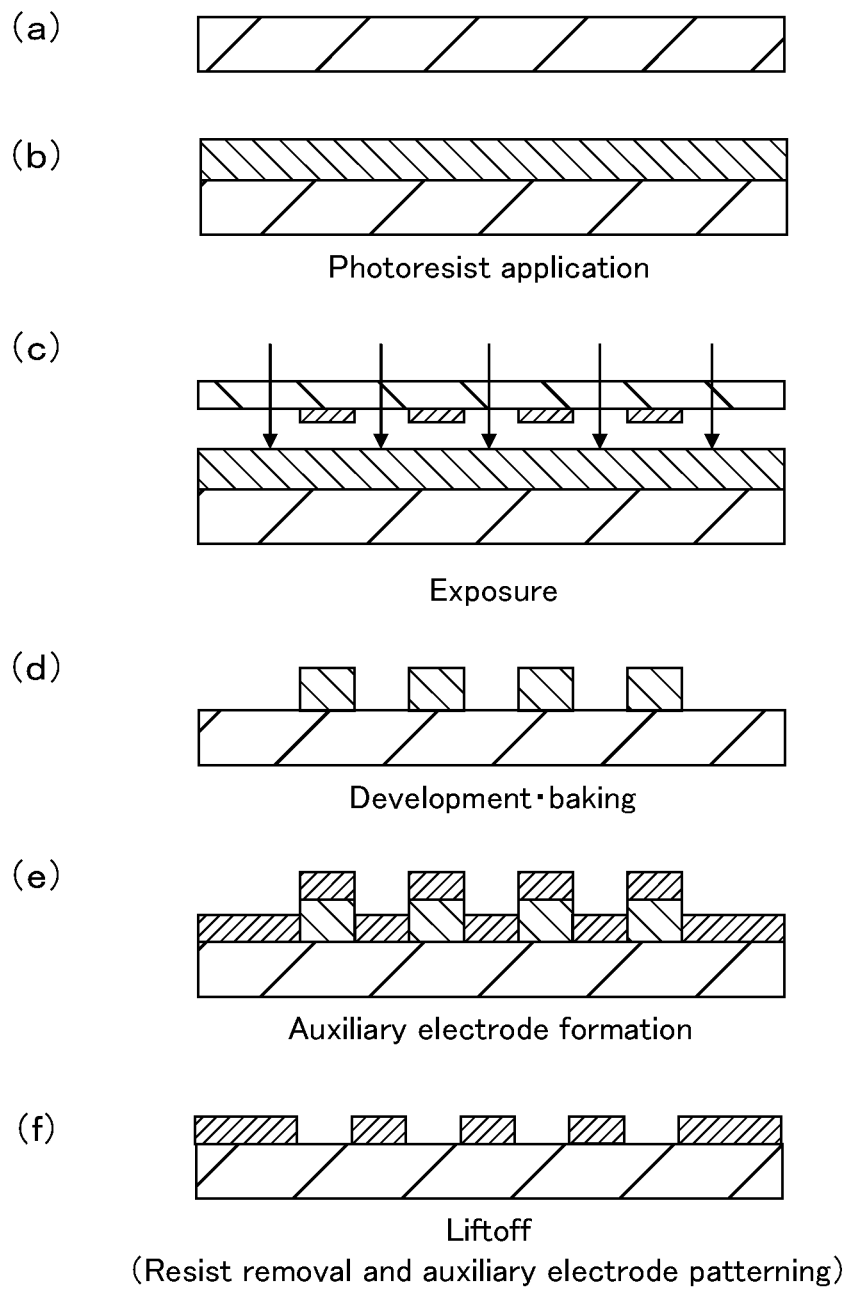
FIGS. 6A(a) to (f) show cross sectional views for illustrating an example of a method for manufacturing the organic EL lighting panel substrate of Embodiment 3.

First, as shown in FIG. 6A(a), translucent substrate 11 is provided. Next, as shown in FIG. 6A(b), a photoresist is applied. Then, as shown in FIGS. 6A(c) and (d), the substrate is exposed through a photomask followed by the development and baking to pattern the photoresist. At this time, the resist at the positions corresponding to an auxiliary electrode-forming part and an upper electrode lead-out part is removed. Next, as shown in FIG. 6A(e), after forming a layer of an auxiliary electrode-forming material all over the substrate, the photoresist is removed. Thereby, as shown in FIG. 6A(f), the auxiliary electrode-forming material is lifted off except for the auxiliary electrode-forming part and the upper electrode lead-out part, and thus auxiliary electrode 13 can be patterned (auxiliary electrode formation step).

Figure 6B:
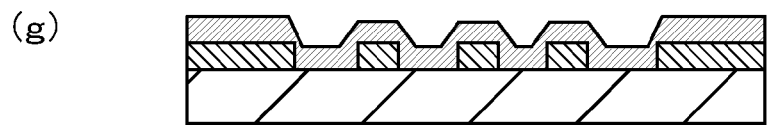
FIGS. 6B(g) to (k) show cross sectional views for illustrating an example of a method for manufacturing the organic EL lighting panel substrate of Embodiment 3.
Figure 6B:
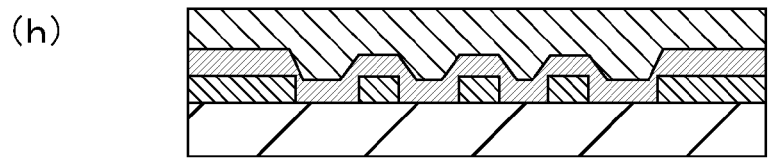
Figure 6B:
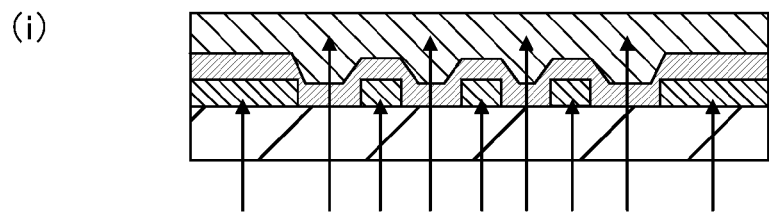
Figure 6B:
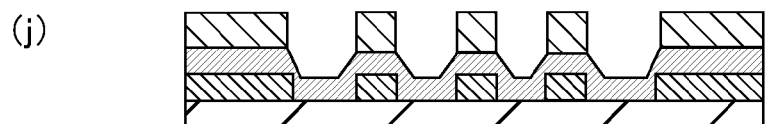
Figure 6B:
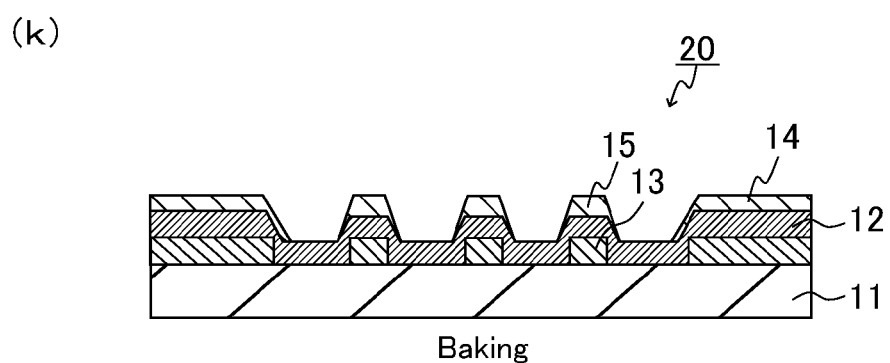

Next, as shown in FIG. 6B(g), transparent electrode 12 formed of ITO or the like is formed by sputtering all over translucent substrate 11 at the side on which auxiliary electrode 13 is formed, for example (transparent electrode formation step). Next, as shown in FIG. 6B(h), an insulating photoresist is applied to transparent electrode 12. Then as shown in FIG. 6B(i), translucent substrate 11 is exposed from the back surface (the surface opposite to the photoresist-applied surface), and the development is performed as shown in FIG. 6B(j). At this time, since the light is blocked at the position on which auxiliary electrode 13 is formed and the position corresponding to the upper electrode lead-out part, the photoresist can be patterned to suit the light-blocking part without using a photomask. Then, as shown in FIG. 6B(k), by baking the substrate after development (post-bake), insulating layer 14 and auxiliary electrode-insulating member 15 are formed (insulating layer formation step). In this manner, for example, organic EL lighting panel substrate 20 shown in FIG. 5 can be manufactured.

Figure 9A:
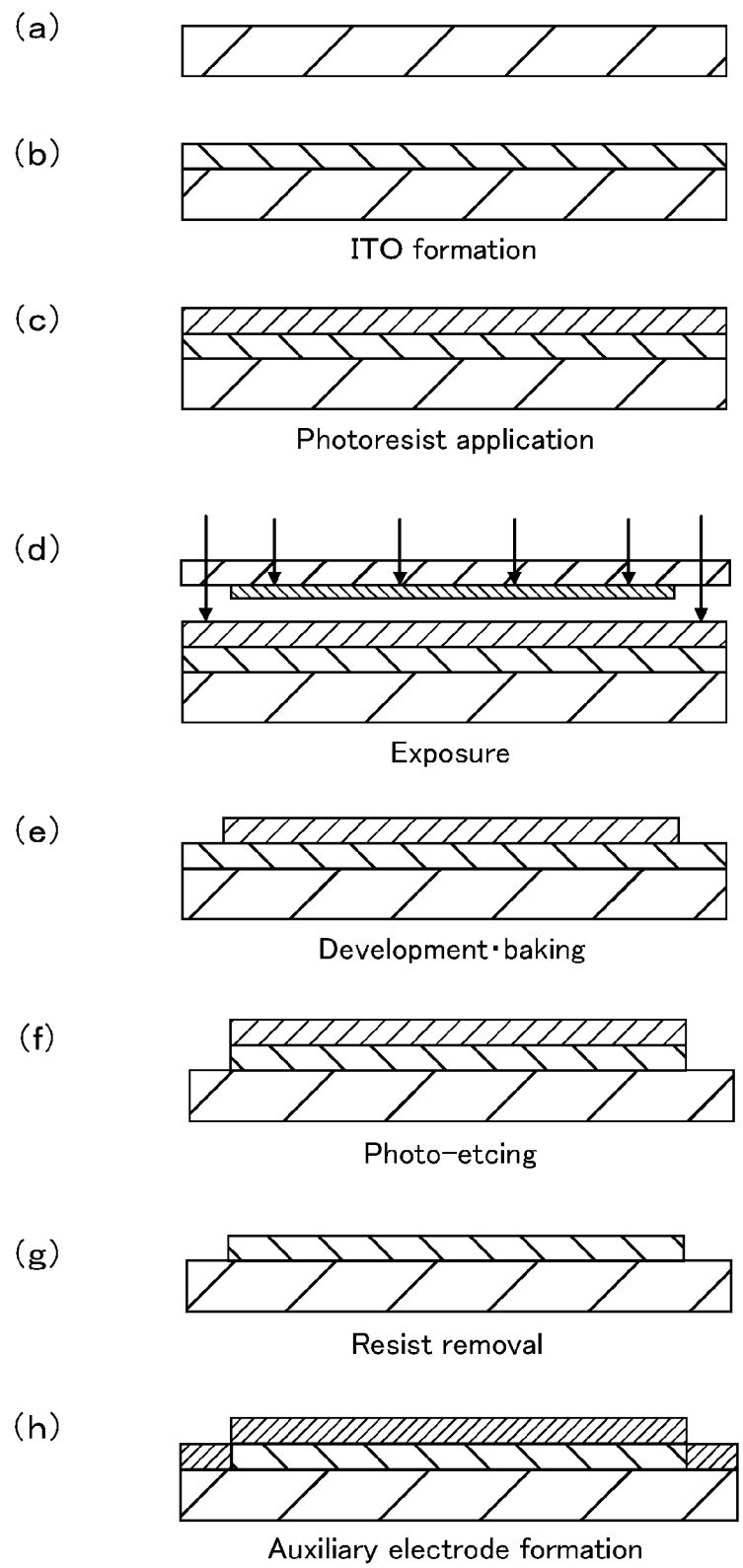
FIGS. 9A(a) to (h) show cross sectional views for illustrating an example of a method for manufacturing a conventional organic EL lighting panel substrate.
Figure 9B:
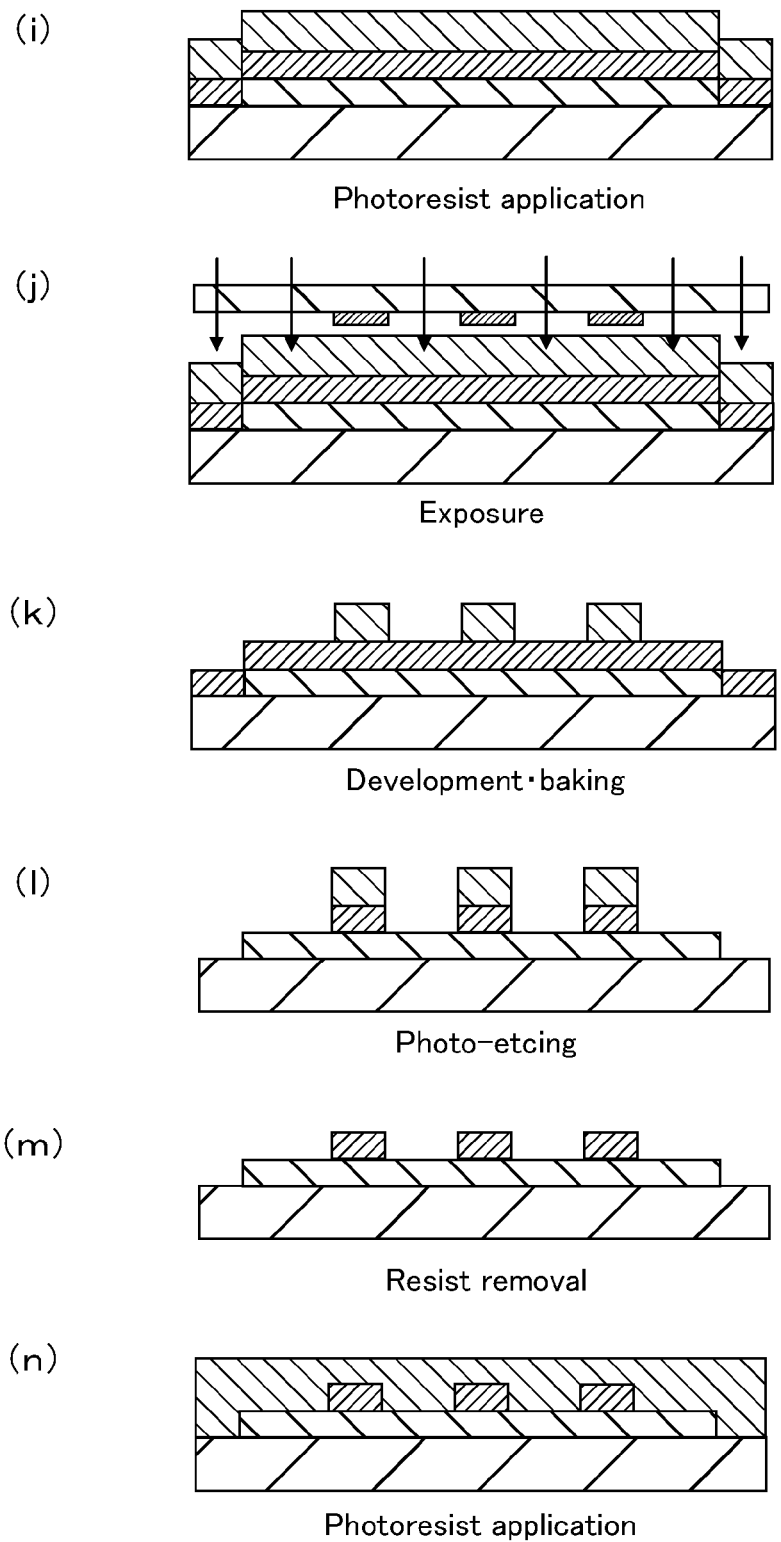
FIGS. 9B(i) to (n) show cross sectional views for illustrating an example of a method for manufacturing a conventional organic EL lighting panel substrate.
Figure 9C:
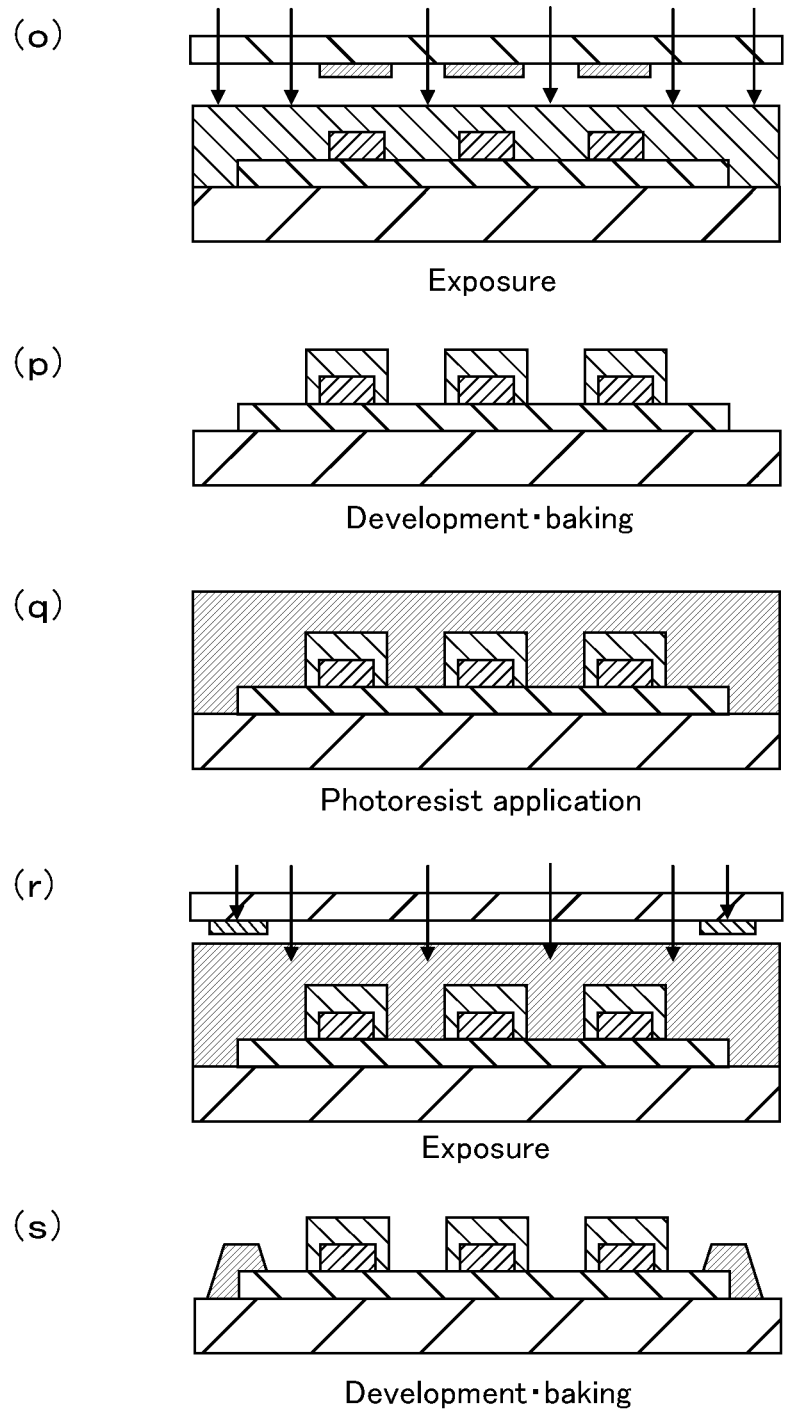
FIGS. 9C(o) to (s) show cross sectional views for illustrating an example of a method for manufacturing a conventional organic EL lighting panel substrate.

While four photomasks and twenty-two steps were required for the manufacturing of an organic EL lighting panel substrate shown in FIGS. 9A to C, only one photomask and eleven steps are required for the above-described manufacturing method. Note here that, the method for manufacturing organic EL lighting panel substrate 20 is not limited to this example.

Embodiment 4

Figure 7:
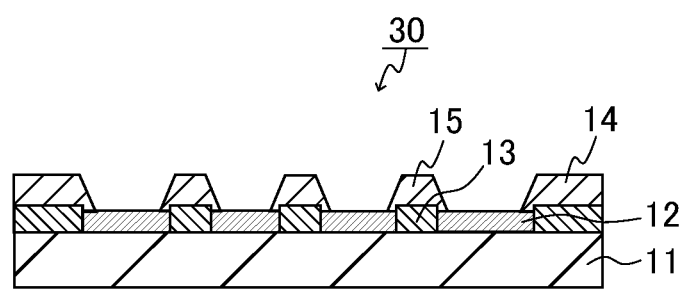
FIG. 7 is a cross sectional view showing the configuration of another example of an organic EL lighting panel substrate of the present invention (Embodiment 4).

An organic EL lighting panel substrate of the present embodiment includes a transparent electrode patterned on a surface of a translucent substrate and includes an auxiliary electrode patterned between the patterned transparent electrode. Furthermore, an organic EL lighting panel substrate of the present embodiment is an example of an organic EL lighting panel substrate in which a layer formed of the same material as an auxiliary electrode is arranged on the translucent substrate at the position corresponding to an upper electrode lead-out part and an insulating layer is arranged on the transparent electrode at the positions corresponding to the auxiliary electrode and the upper electrode lead-out part. FIG. 7 shows the configuration of organic EL lighting panel substrate 30 of the present embodiment.

Next, an example of a method for manufacturing organic EL lighting panel substrate 30 will be described with reference to FIGS. 8A and 8B. Note here that the method for manufacturing an organic EL lighting panel substrate 30 is not limited to the following example.

Figure 8A:
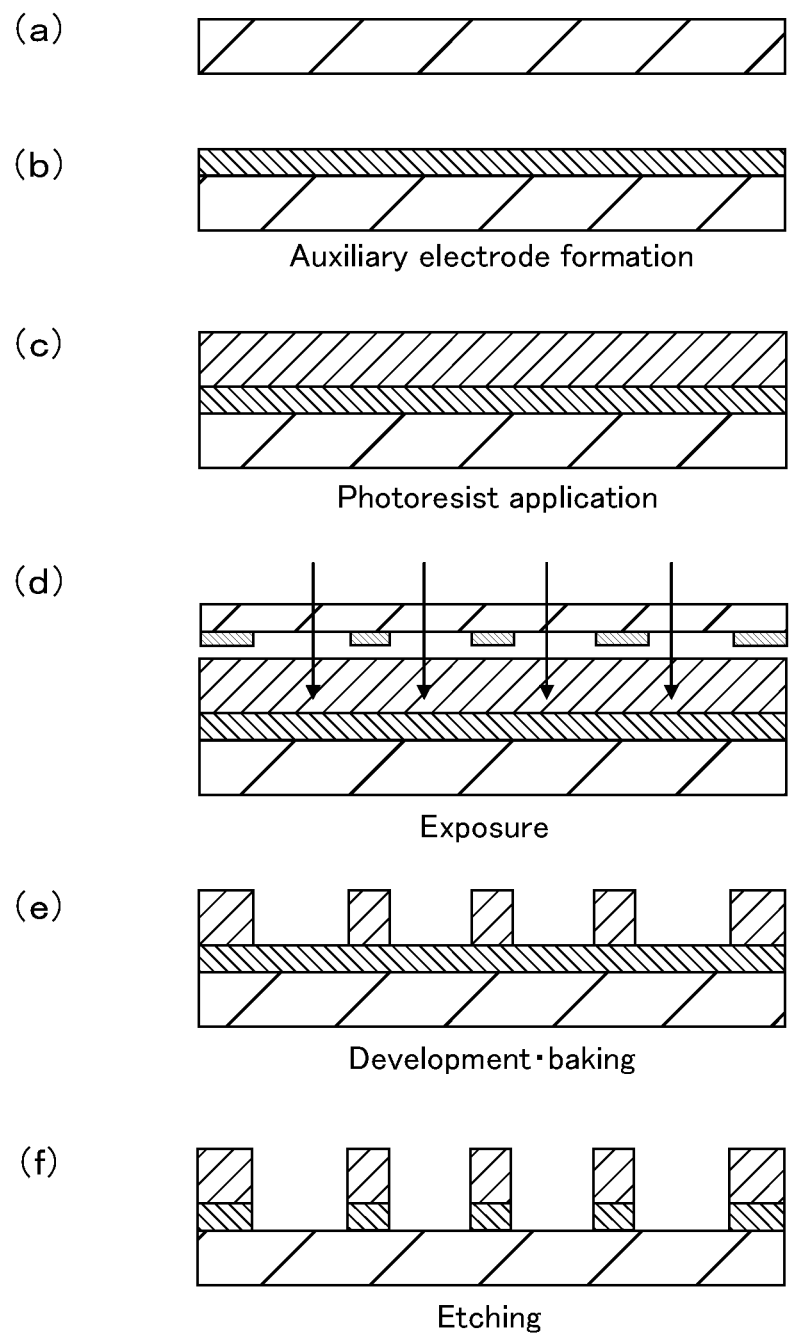
FIGS. 8A(a) to (f) show cross sectional views for illustrating an example of a method for manufacturing the organic EL lighting panel substrate of Embodiment 4.

First, as shown in FIG. 8A(a), translucent substrate 11 is provided. Next, as shown in FIG. 8A(b), a layer of an auxiliary electrode-forming material is formed on a surface of translucent substrate 11. Next as shown in FIG. 8A(c), a photoresist is applied. Then, as shown in FIG. 8A(d) and (e), the substrate is exposed through a photomask followed by the development and baking to pattern the photoresist. At this time, by etching the layer of the auxiliary electrode-forming material, auxiliary electrode 13 can be patterned as shown in FIG. 8A(f) (auxiliary electrode formation step). By performing the patterning so as to cause the photoresist to remain at the position corresponding to an upper electrode lead-out part, a conductive layer can be formed at the position corresponding to the upper electrode lead-out part.

Figure 8B:
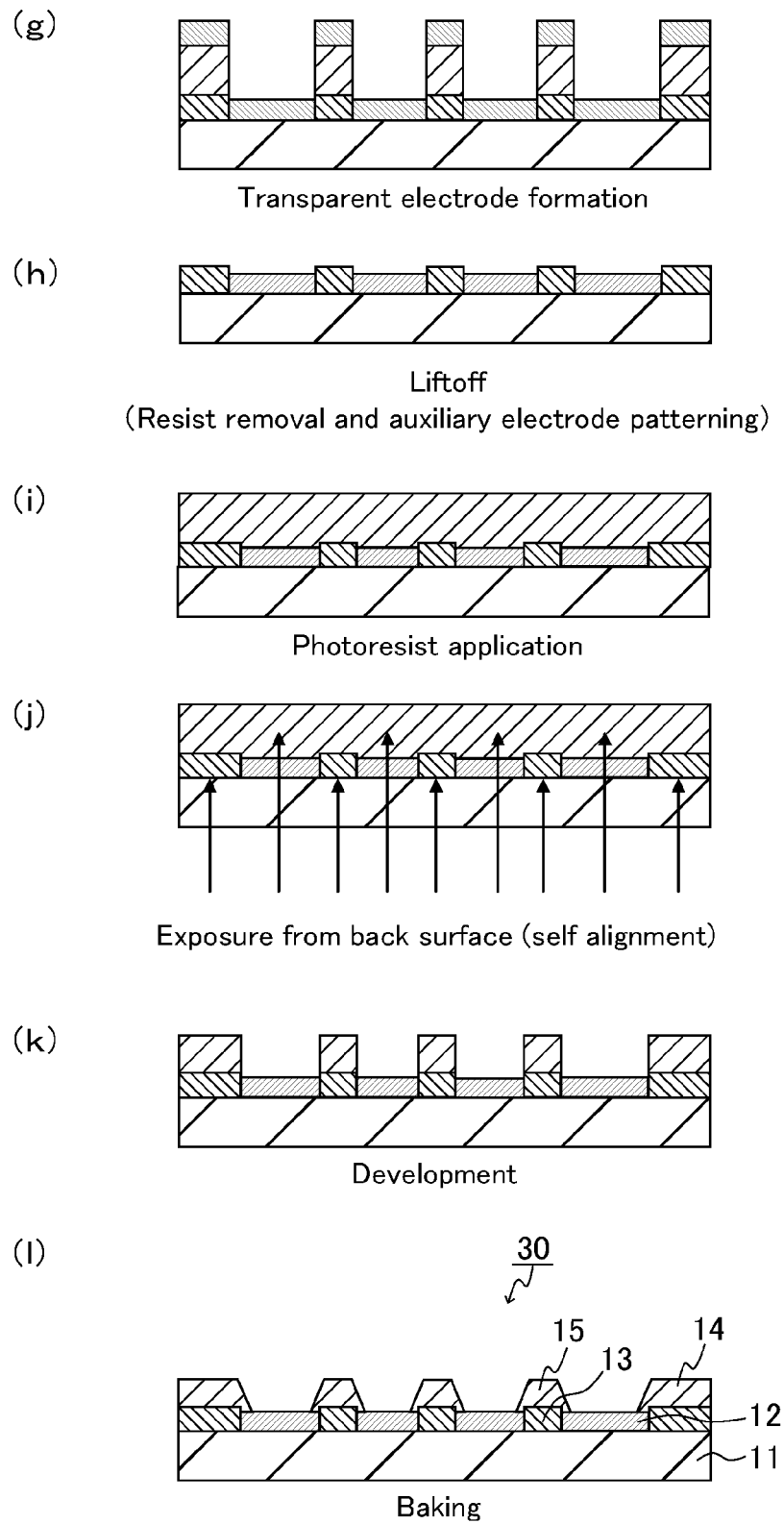
FIGS. 8B(g) to (i) show cross sectional views for illustrating an example of a method for manufacturing the organic EL lighting panel substrate of Embodiment 4.

Next, as shown in FIG. 8B(g), after forming a layer of a transparent electrode-forming material such as ITO or the like all over translucent substrate 11 at the side on which auxiliary electrode 13 is formed by sputtering, for example, the photoresist is removed. Thereby, as shown in FIG. 8B(h), a transparent electrode at an auxiliary electrode-forming part and a conductive layer-forming part is lifted off, and thus transparent electrode 12 can be patterned (transparent electrode formation step). Next, as shown in FIG. 8B(i), an insulating photoresist is applied all over translucent substrate 11 at the side on which transparent electrode 12 and the like are formed. Then as shown in FIG. 8B(j), translucent substrate 11 is exposed from the back surface (the surface opposite to the photoresist-applied surface), and the development is performed as shown in FIG. 8B(k). At this time, since the light is blocked at the position on which auxiliary electrode 13 is formed and the position corresponding to the upper electrode lead-out part, the photoresist can be patterned to suit the light-blocking part without using a photomask. Then, as shown in FIG. 8B(l), by baking the substrate after development (post-bake), insulating layer 14 and auxiliary electrode-insulating member 15 are formed (insulating layer formation step). In this manner, for example, organic EL lighting panel substrate 30 shown in FIG. 7 can be manufactured.

Figure 10A:
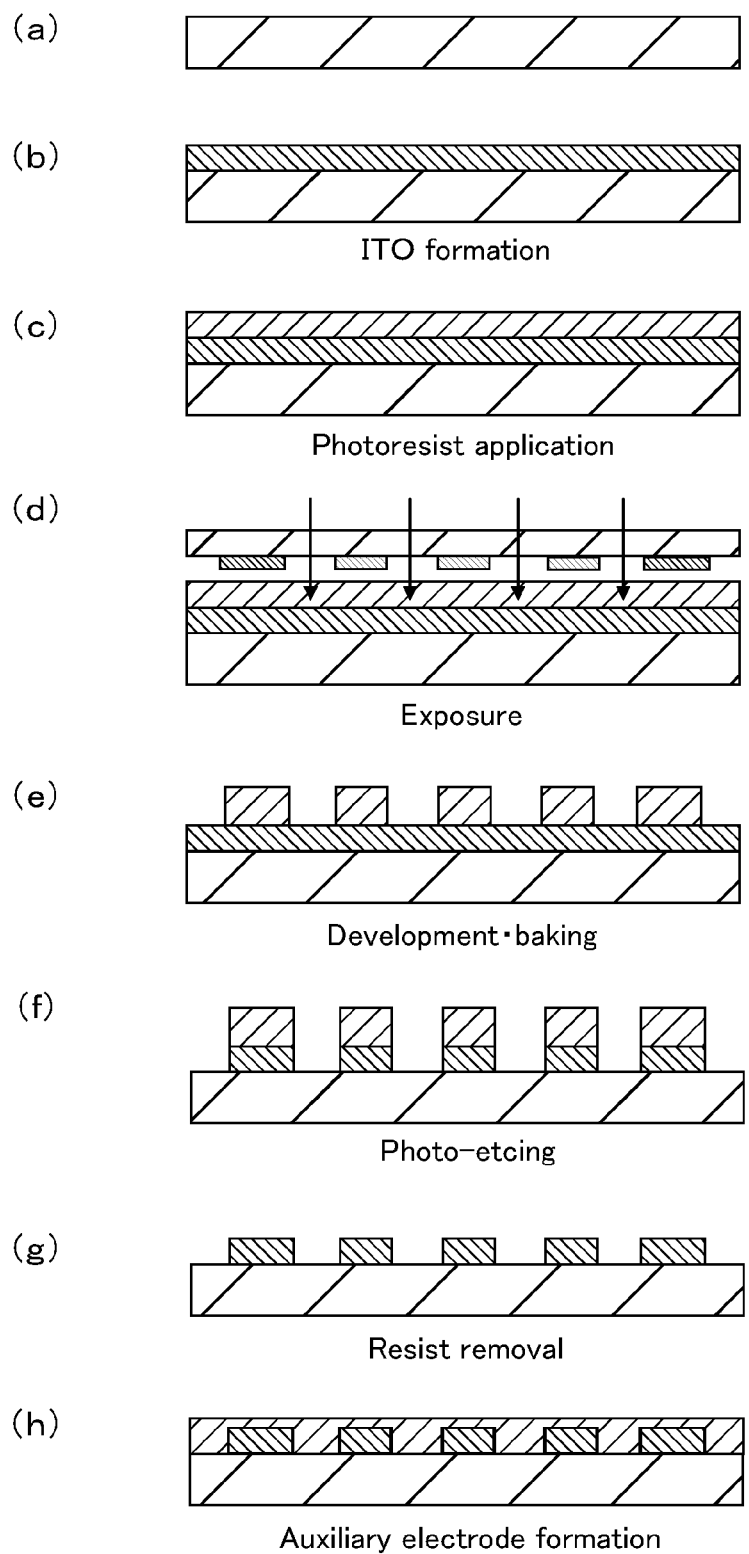
FIGS. 10A(a) to (h) show cross sectional views for illustrating another example of a method for manufacturing a conventional organic EL lighting panel substrate.
Figure 10B:
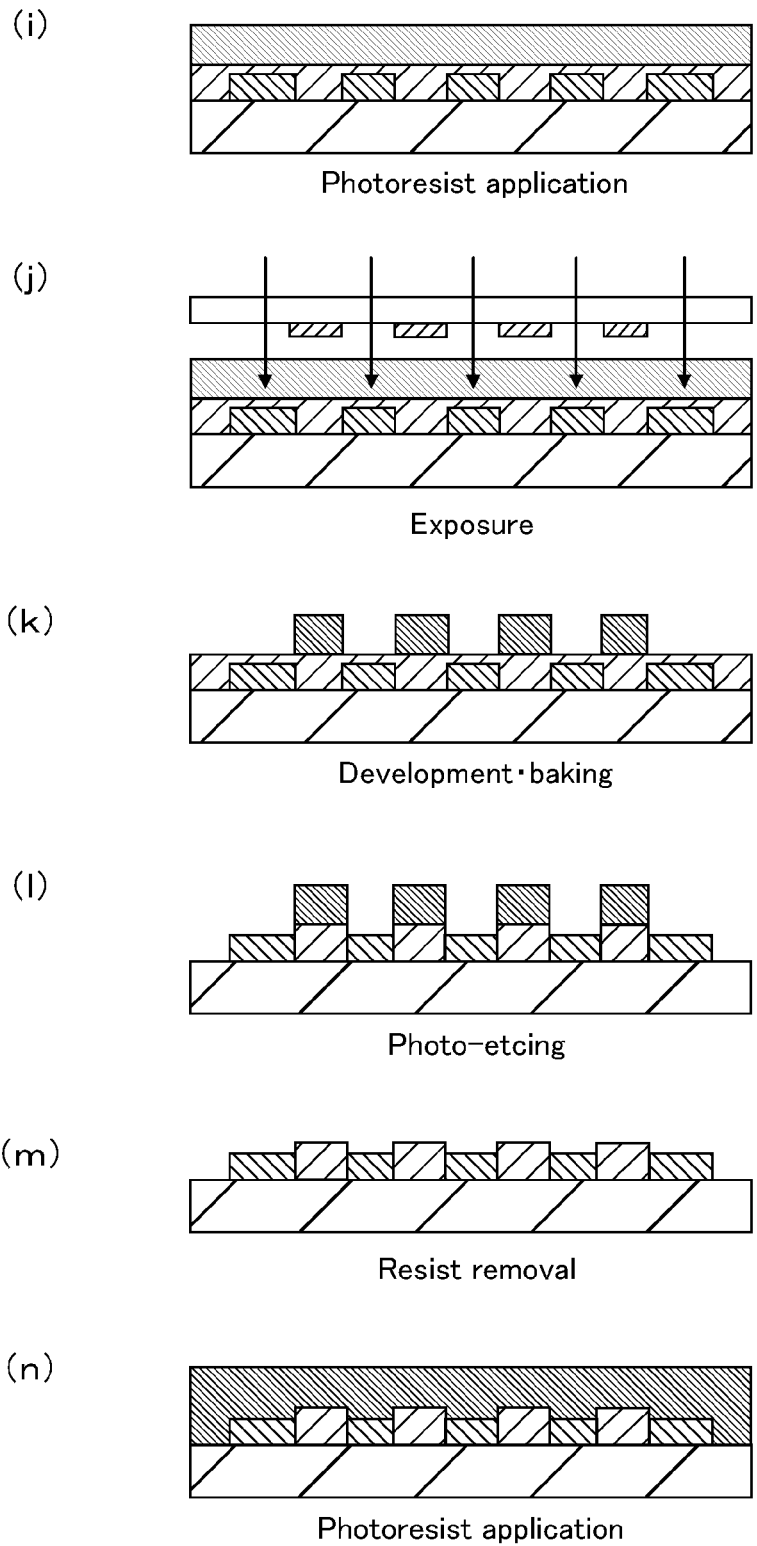
FIGS. 10B(i) to (n) show cross sectional views for illustrating another example of a method for manufacturing a conventional organic EL lighting panel substrate.
Figure 10C:
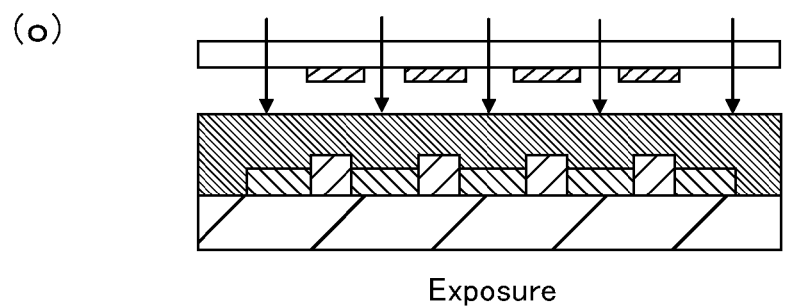
FIGS. 10C(o) to (s) show cross sectional views for illustrating another example of a method for manufacturing a conventional organic EL lighting panel substrate.
Figure 10C:
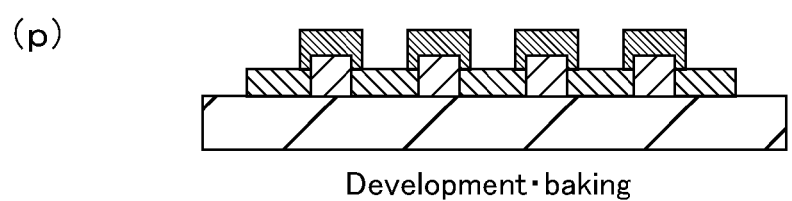
Figure 10C:
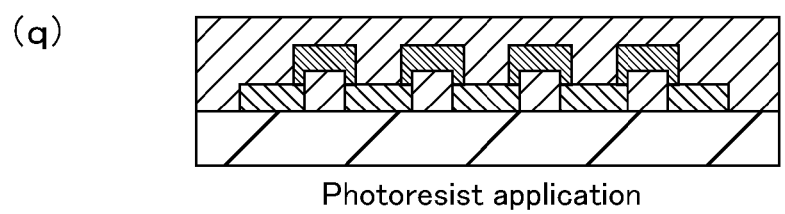
Figure 10C:
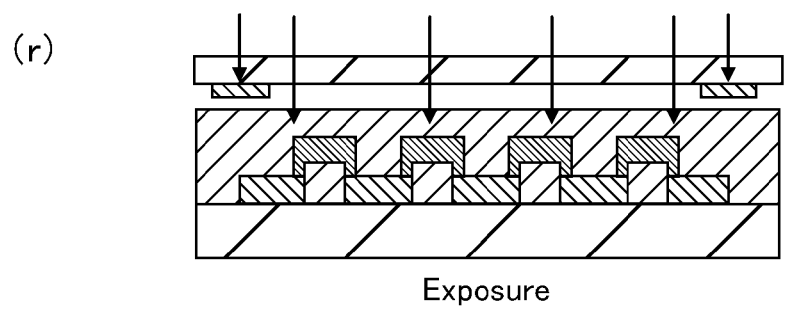
Figure 10C:
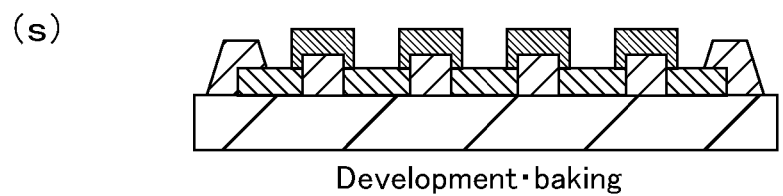

While four photomasks and twenty-two steps were required for the manufacture of a conventional organic EL lighting panel substrate shown in FIGS. 10A to C, only one photomask and twelve steps are required for the above-described manufacturing method. Note here that, the method for manufacturing organic EL lighting panel substrate 30 is not limited to this example.

EXAMPLE

Next, the present invention will be described in more detail with reference to examples of the present invention. However, the present invention is not limited to or restricted by the following examples by any means.

Example 1

(1) Manufacture of Organic EL Lighting Panel

As an organic EL lighting panel of the present example, organic EL lighting panel 100 shown in FIG. 4 having a light emitting surface of 100 mm×100 mm was manufactured as follows. That is, first, an alkali-free glass (thickness: 0.7 mm, produced by Nippon Electric Glass Co., Ltd., OA-10G) was provided as translucent substrate 11. ITO was formed as transparent electrode 12 on alkali-free glass 11 by sputtering (ITO film 12, thickness: 300 nm). Next, an insulating novolac positive type photoresist (product name "PFR-7750", produced by JSR Corporation) was applied in such a manner as to cover ITO film 12, and the patterning was performed so as to remove the resist at an auxiliary electrode-forming part by photolithography. Here, as a mask used at the time of exposure, a gray-tone mask including an exposure part for the part corresponding to an auxiliary electrode-forming part, a light-blocking part for the part corresponding to an upper electrode lead-out part, and a gray-tone part for the part corresponding to a lift-off part (part on which an auxiliary electrode is not formed) was used. The use of the gray-tone mask made it possible to attain the thickness of the insulating photoresist at the part corresponding to the upper electrode lead-out part thicker than the thickness of the photoresist at the part corresponding to the lift-off part.

Next, after forming a layer of auxiliary electrode-forming materials (Mo—Nb/Al—Nd/Mo—Nb (MAM)) by sputtering so as to have the thickness of 460 nm (30 nm/400 nm/30 nm), the photoresist was removed (liftoff), and the auxiliary electrode 13 was patterned so as to be in a grid pattern having a width of 180 μm and with 5 mm-pitch between the adjacent auxiliary electrodes (auxiliary electrode formation step). At this time, since the photoresist remained thickly at the position corresponding to the upper electrode lead-out part, insulating layer 14 could be formed by causing the insulating photoresist to remain at the position (insulating layer formation step).

Next, an insulating novolac positive type photoresist (product name "PFR-7750") was applied all over translucent substrate 11 at the side on which auxiliary electrode 13 and insulating layer 14 are formed so as to obtain a layer having a thickness of 1.2 μm, translucent substrate 11 was exposed from the back surface (the surface opposite to the photoresist-applied surface), and the development was performed. At this time, since the light was blocked at the parts on which auxiliary electrode 13 and insulating layer 14 are formed, the photoresist could be patterned to suit an auxiliary electrode 13-forming part and an insulating layer 14-forming part without using a photomask or the like. Then, by baking the substrate after development (post-bake), auxiliary electrode-insulating member 15 was formed. The thickness and width of auxiliary electrode-insulating member 15 were respectively 0.85 µm (residual film ratio: 71%) and 200 µm. In this manner, an organic EL lighting panel substrate with ITO film 12 as an anode (transparent electrode) and MAM as auxiliary electrode 13 was manufactured.

Next, organic EL layer 111 was formed on ITO film 12 and auxiliary electrode-insulating member 15 by a vacuum evaporation method, and finally, aluminum cathode 112 was formed on organic EL layer 111 by a vacuum evaporation method. In this manner, organic EL lighting panel 100 shown in FIG. 4 was manufactured. Organic EL layer 111 was a laminate in which a hole injection layer, a hole transport layer, a light-emitting layer, a hole-blocking layer, an electron transport layer, and an electron injection layer were laminated in this order from the ITO film 12 side. The materials for forming the respective layers in the laminate were as follows:

Hole injection layer: Cu—Pc (copper phthalocyanine)
Hole transport layer: α-NPD (N,N'-diphenyl-N—N-bis(1-naphthyl)-1,1'-biphenyl)-4,4'-diamine
Light-emitting layer:
   Host: CBP (4,4'-biscarbazolylbiphenyl)
   Dopant: Ir(ppy)$_3$ (tris-(2 phenylpyridine)iridium complex), Btp$_2$Ir(acac)
(bis(2-(2'-benzo(4,5-α)thienyl)pyridinate-N,C2')(acetylacetonate)iridium complex), FIr(pic)
((bis(4,6-di-fluorophenyl)-pyridinate-N,C2')picolinateiridium complex)
Hole-blocking layer: BCP (2,9-dimethyl-4,7-diphenyl-1,10-phenanthroline)
Electron transport layer: Alq$_3$
Electron injection layer: LiF (2) Characteristic Evaluation (2-1) Luminance Uniformity Evaluation An organic EL lighting panel of the present example was turned on with a constant-current of 25 A/m$^2$ as a drive current. The drive voltage was 4.5 V and the luminance was 1000 cd/m$^2$. The luminance uniformity of this organic EL lighting panel was evaluated as follows. That is, the luminance values at nine points within a surface of this organic EL lighting panel were measured and the highest luminance value and the lowest luminance value among the luminance values at the nine points were substituted into the following equation (I) to calculate the luminance uniformity (hereinafter, the same applies). The lower the luminance uniformity value (%) is, the higher the luminance uniformity within a surface of an organic EL lighting panel becomes. The luminance uniformity of this organic EL lighting panel was 3%.

Luminance uniformity (%)=(highest luminance value−lowest luminance value)/highest luminance value×100    (I)

(2-2) Continuous Lighting Evaluation

This organic EL lighting panel was continuously lighted at the same current density as (2-1) (n=10). As a result, after continuous lighting of 10000 hours, all organic EL lighting panels were lighted with stability.

Comparative Example 1

(1) Manufacture of Organic EL Lighting Panel

An organic EL lighting panel of the present comparative example was manufactured in the same manner as in Example 1 except that auxiliary electrode 13 was not formed.

(2) Characteristic Evaluation (2-1) Luminance Uniformity Evaluation

An organic EL lighting panel of the present comparative example was turned on with a constant-current of 25 A/m$^2$ as a drive current. The drive voltage was 5.6 V and the luminance was 810 cd/m$^2$. The luminance uniformity of this organic EL lighting panel was 35%.

(2-2) Continuous Lighting Evaluation

This organic EL lighting panel was continuously lighted at the same current density as (2-1) (n=10). As a result, within 1000 hours, short circuits were caused in five organic EL lighting panels and the light went off.

Comparative Example 2

(1) Manufacture of Organic EL Lighting Panel

An organic EL lighting panel of the present comparative example was manufactured according to the steps shown in FIGS. 9A to C.

(2) Characteristic Evaluation (2-1) Luminance Uniformity Evaluation

An organic EL lighting panel of the present comparative example was turned on with a constant-current of 25 A/m$^2$ as a drive current. The drive voltage was 4.8 V and the luminance was 970 cd/m$^2$. The luminance uniformity of this organic EL lighting panel was 4%.

(2-2) Continuous Lighting Evaluation

This organic EL lighting panel was continuously lighted at the same current density as (2-1) (n=10). As a result, within 1000 hours, short circuits were caused in four organic EL lighting panels and the light went off.

According to the above-described results, organic EL lighting panels of Example 1 showed high luminance uniformity within the surfaces thereof, prevented short circuits, and showed high reliability. In contrast, organic EL lighting panels of Comparative Example 1 showed low luminance uniformity within the surfaces thereof, caused short circuits, and showed low reliability. Furthermore, with respect to organic EL lighting panels of Comparative Example 2, since resist residues and foreign matters remain on a substrate due to a repetition of a photolithography step and the like, defects/problems such as a short circuit and the like are caused frequently in an organic EL panel, and therefore the organic EL lighting panels of Comparative Example 2 showed significantly low yields and reliability.

As described above, according to an organic EL lighting panel substrate, a method for manufacturing an organic EL lighting panel substrate, and an organic EL lighting panel using the organic EL lighting panel substrate of the present invention, it is possible to greatly reduce manufacturing steps, improve the luminance uniformity and chromaticity uniformity within a surface of an organic EL lighting panel, and achieve the excellent yield and reliability. This is also effective in the case of forming multiple organic EL lighting panels on a big transparent substrate, and the effect becomes more significant. Also, since the number of photo-etching steps and photolithography steps can be reduced, the cycle time can be reduced and the cost can be reduced. Furthermore, in a conventional organic EL lighting panel, since there is a difference in level between a translucent substrate and an ITO part at the end (edge) of a transparent conductive film such as ITO or the like, a short circuit was likely caused between the end (edge) and a cathode formed on an organic layer. For preventing the short circuit, a so-called edge cover (or insulator), which is a cover for a difference in level of resists, has been formed in the subsequent step. On the other hand, since the structure of the present invention does not require the edge cover, the reduction of steps and row costs can be achieved as well as the improvement of yield because of less occurrence of short circuit can be achieved. Furthermore, since the number of photo-etching steps can be reduced, it is possible to reduce an etching waste liquid due to wet etching and supply an environmentally-friendly organic EL lighting panel substrate. Also, by reducing the number of photolithography steps, it is possible to reduce defects/problems such as a short circuit and the like caused in an organic EL panel due to a resist residue or the like and improve the yield. An organic EL lighting panel of the present invention can be applied, for example, to an organic EL lighting device; a backlight of a liquid crystal display or the like; or the like. Note here that the usage of an EL lighting panel of the present invention is not limited to the above-described usage but can be applied to a wide range of field.

The invention of the present application was described above with reference to the embodiments and examples. However, the invention of the present application is not limited to the above-described embodiments and examples. Various changes that can be understood by those skilled in the art can be made in the configurations and details of the invention of the present application within the scope of the invention of the present application.

This application claims priority from Japanese Patent Application No. 2012-182746 filed on Aug. 21, 2012. The entire disclosure of this Japanese patent application is incorporated herein by reference.

EXPLANATION OF REFERENCE NUMERALS 10, 10A, 20, and 30 organic EL lighting panel substrate
11 translucent substrate
12 transparent electrode (ITO)
13 auxiliary electrode
14 insulating layer
15 auxiliary electrode-insulating member
100 organic EL lighting panel
111 organic EL layer
112 upper electrode

The invention claimed is:

1. An organic EL lighting panel substrate comprising:
   a translucent substrate;
   a transparent electrode; and
   an auxiliary electrode, wherein
   the transparent electrode is arranged on a surface of the translucent substrate, and the whole transparent electrode is electrically connected,
   the auxiliary electrode is electrically connected to the transparent electrode, and
   the organic EL lighting panel substrate further comprises: an insulating layer at a position corresponding to an electrode lead-out part of an upper electrode of an organic EL layer that forms an organic EL lighting panel, the upper electrode being provided above the translucent substrate in such a manner as to face the transparent electrode; and a conductive layer between the translucent substrate and the insulating layer.

2. The substrate according to claim 1, wherein the conductive layer includes the same material as at least one of the transparent electrode and the auxiliary electrode.

3. The organic EL lighting panel substrate of claim 1, comprising plural of the auxiliary electrode, wherein,
   the translucent substrate has an outer perimeter that defines an upper surface area of the translucent substrate,
   a lower surface of the transparent electrode is in contact with and covers all of an upper surface area of the translucent substrate, each part of the transparent electrode within the upper surface area of the translucent substrate is electrically connected to all other parts of the transparent electrode within the upper surface area of the translucent substrate, and
   a lower surface of each of the auxiliary electrodes is in contact with an upper surface of the transparent electrode, the plural auxiliary electrodes being spaced apart from each other on the transparent electrode and including first outside auxiliary electrode, a second outside auxiliary electrode, and at least one inside auxiliary electrode located between the first and second outside auxiliary electrodes,
   the insulating layer is located in contact with the upper surface of the transparent electrode within the upper surface area of the translucent substrate, the insulating layer including a first insulating layer region located outside and spaced apart from the first outside auxiliary electrode and a second insulating layer region located outside and spaced apart from the second outside auxiliary electrode,
   the electrode lead-out part of the upper electrode comprising i) a first electrode lead-out part located on an upper surface of the first insulating layer region, ii) a second electrode lead-out part located on an upper surface of the second insulating layer region, wherein the upper electrode includes a further electrode part that extends from the first electrode lead-out part to the second electrode lead-out part and is located over and spaced apart from the plural auxiliary electrodes.

4. The organic EL lighting panel substrate of claim 3, wherein the plural auxiliary electrodes are spaced apart from each other on the transparent electrode at constant intervals in a grid pattern.

5. The organic EL lighting panel substrate of claim 4, further comprising plural spaced apart electrode-insulating members, each electrode-insulating member covering one of the plural auxiliary electrode, a lower surface of each electrode-insulating member being in contact with the upper surface of the transparent electrode,
   wherein the organic EL layer extends from the upper surface of the transparent electrode to a lower surface of the further electrode part of the upper electrode that extends from the first electrode lead-out part to the second electrode lead-out part.

6. The organic EL lighting panel substrate of claim 3, further comprising;
  plural spaced apart electrode-insulating members, each electrode-insulating member covering one of the plural auxiliary electrode, a lower surface of each electrode-insulating member being in contact with the upper surface of the transparent electrode,
  wherein the organic EL layer extends from the upper surface of the transparent electrode to a lower surface of the further electrode part of the upper electrode that extends from the first electrode lead-out part to the second electrode lead-out part, the organic EL layer contacting the upper surface of the transparent electrode in regions between adjacent auxiliary electrodes, a region between the first insulating layer region and the first outside auxiliary electrode, and a region between second insulating layer region and the second outside auxiliary electrode.

7. The organic EL lighting panel substrate of claim 1, comprising plural of the auxiliary electrode, wherein,
  a lower surface of the transparent electrode is in contact with an upper surface area of the translucent substrate, each part of the transparent electrode in contact with the translucent substrate being electrically connected to all other parts of the transparent electrode in contact with the upper surface area of the translucent substrate, and
  the plural auxiliary electrodes area spaced apart from each other on the transparent electrode and included first outside auxiliary electrode, a second outside auxiliary electrode, and at least one inside auxiliary electrode located between the first and second outside auxiliary electrodes,
  the insulating layer is located in contact with the upper surface of the transparent electrode, the insulating layer including a first insulating layer region located outside and spaced apart from the first outside auxiliary electrode and a second insulating layer region located outside and spaced apart from the second outside auxiliary electrode,
  the electrode lead-out part of the upper electrode comprising i) a first electrode lead-out part located on an upper surface of the first insulating layer region, ii) a second electrode lead-out part located on an upper surface of the second insulating layer region, wherein the upper electrode includes a further electrode part that extends from the first electrode lead-out part to the second electrode lead-out part and is located over and spaced apart from the plural auxiliary electrodes, and
  the organic EL layer extends from the upper surface of the transparent electrode to a lower surface of the further electrode part of the upper electrode that extends from the first electrode lead-out part to the second electrode lead-out part, the organic EL layer contacting the upper surface of the transparent electrode in regions between adjacent auxiliary electrodes, a region between the first insulating layer region and the first outside auxiliary electrode, and a region between second insulating layer region and the second outside auxiliary electrode.

* * * * *